United States Patent
Mizuno et al.

(10) Patent No.: US 7,432,215 B2
(45) Date of Patent: Oct. 7, 2008

(54) SEMICONDUCTOR DEVICE MANUFACTURING METHOD AND SEMICONDUCTOR MANUFACTURING APPARATUS

(75) Inventors: Norikazu Mizuno, Nakano-ku (JP); Kiyohiko Maeda, Nakano-ku (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 11/762,033

(22) Filed: Jun. 12, 2007

(65) Prior Publication Data
US 2007/0238292 A1 Oct. 11, 2007

Related U.S. Application Data

(63) Continuation of application No. 11/330,548, filed on Jan. 11, 2006, now abandoned.

(30) Foreign Application Priority Data
Nov. 24, 1999 (JP) ................ 11-333129

(51) Int. Cl.
H01L 21/318 (2006.01)
H01L 21/3105 (2006.01)
H01L 21/314 (2006.01)
(52) U.S. Cl. ............. 438/757; 438/794; 438/905
(58) Field of Classification Search ........ 438/757, 438/791, 794, 905
See application file for complete search history.

(56) References Cited

U.S. PATENT DOCUMENTS

| 4,720,395 | A | 1/1988 | Foster ............... 427/162 |
| 4,877,651 | A | 10/1989 | Dory ............... 427/255.18 |
| 5,129,958 | A | 7/1992 | Nagashima et al. ....... 134/22.1 |
| 5,413,670 | A | 5/1995 | Langan et al. ........... 134/1.2 |
| 5,421,957 | A | 6/1995 | Carlson et al. ........... 216/58 |
| 5,868,852 | A | 2/1999 | Johnson et al. ........... 134/1.1 |
| 5,874,368 | A | 2/1999 | Laxman et al. ........... 438/794 |
| 5,976,900 | A | 11/1999 | Qiao et al. ............. 438/14 |
| 6,251,802 | B1 | 6/2001 | Moore et al. ........... 438/778 |
| 6,255,222 | B1 | 7/2001 | Xia et al. .............. 438/710 |
| 6,268,299 | B1 | 7/2001 | Jammy et al. ........... 438/791 |
| 6,486,083 | B1 | 11/2002 | Mizuno et al. ........... 438/794 |
| 6,974,781 | B2 * | 12/2005 | Timmermans et al. ...... 438/794 |
| 2006/0062913 | A1 * | 3/2006 | Wang et al. ............ 427/248.1 |
| 2006/0286774 | A1 * | 12/2006 | Singh et al. ............. 438/478 |

(Continued)

FOREIGN PATENT DOCUMENTS

JP 06-080962 3/1994 ............... 252/79.3

(Continued)

OTHER PUBLICATIONS

Hines et al. "Reducing Perfluorinated Compound Emissions", IEEE, 1998, pp. 203-207.

(Continued)

*Primary Examiner*—M. Wilczewski
(74) *Attorney, Agent, or Firm*—Hogan & Hartson LLP (57) ABSTRACT

A semiconductor device manufacturing method comprises a first step of forming, by a thermal chemical vapor deposition method, a silicon nitride film on an object disposed in a reaction container, with bis tertiary butyl amino silane and $NH_3$ flowing into the reaction container, and a second step of removing silicon nitride formed in the reaction container, with $NF_3$ gas flowing into the reaction container.

10 Claims, 6 Drawing Sheets

U.S. PATENT DOCUMENTS

2006/0286775 A1* 12/2006 Singh et al. .................. 438/478
2006/0286776 A1* 12/2006 Ranish et al. ................ 438/478
2007/0137572 A1* 6/2007 Matsuura et al. ......... 118/728 E

FOREIGN PATENT DOCUMENTS

| JP | 07-078808 | 3/1995 |
| JP | 08-124870 | 5/1996 |
| JP | 2003-51452 | * 2/2003 |

OTHER PUBLICATIONS

Ino et al. "Plasma Enhanced in SituChamber Cleaning Evaluated by Extracted-Plasma-Parameter Analysis", IEEE, vol. 9, No. 2, May 1996, pp. 230-240.

Mendicino et al. "Remote Microwave Technology for Chamber Clean to Reduce PFC Emissions", Jan. 1998, IEEE, pp. 267-276.

* cited by examiner

SEMICONDUCTOR DEVICE MANUFACTURING METHOD AND SEMICONDUCTOR MANUFACTURING APPARATUS

CROSS-REFERENCE TO RELATED APPLICATIONS

This is a continuation of application Ser. No. 11/330,548 filed Jan. 11, 2006, which is a continuation of application Ser. No. 09/670,917 filed Sep. 29, 2000, which applications are hereby incorporated by reference in their entireties. This application also claims benefit of priority under 35 USC 119 to Japanese Patent Application No. 11-333129 filed Nov. 24, 1999, the entire content of which is incorporated by reference in its entirety.

BACKGROUND OF THE INVENTION

1. Field of the Invention

The present invention relates to a semiconductor device manufacturing method and a semiconductor manufacturing apparatus, and more particularly, to a semiconductor device manufacturing method including a silicon nitride film manufacturing step using a thermal CVD (Chemical Vapor Deposition) method, and to a semiconductor manufacturing apparatus preferably used for the method.

2. Description of the Related Art

Conventionally, it is common that a silicon nitride film used in a semiconductor device is formed using mixed gas of $SiH_2Cl_2$ (DCS, hereinafter) and $NH_3$.

According to this method, however, it is necessary to form the silicon nitride film at a temperature as high as 700° C. to 800° C. and as a result, there is a problem that impurities are adversely diffused deeply into a shallow diffused layer and a semiconductor device element can not be formed small in size. Further, there is a problem that $NH_4Cl$ (ammonium chloride), which is a by-product of reaction, adheres to a discharge port, this $NH_4Cl$ generates rust on a metal surface, and metal contamination is generated on a semiconductor wafer.

SUMMARY OF THE INVENTION

To solve the problems, the present inventors examined forming a silicon nitride ($Si_3N_4$) film using $NH_3$ and $SiH_2(NH(C_4H_9))_2$ (bis tertiary butyl amino silane: BTBAS, hereinafter) as raw gases. As a result, the inventors have found that the silicon nitride film can be formed at a low temperature of about 600° C. and $NH_4Cl$, which is a cause of metal contamination, is not generated.

However, the present inventors have found that the $Si_3N_4$ film formed using BTBAS has the following drawbacks.

Figure 4:
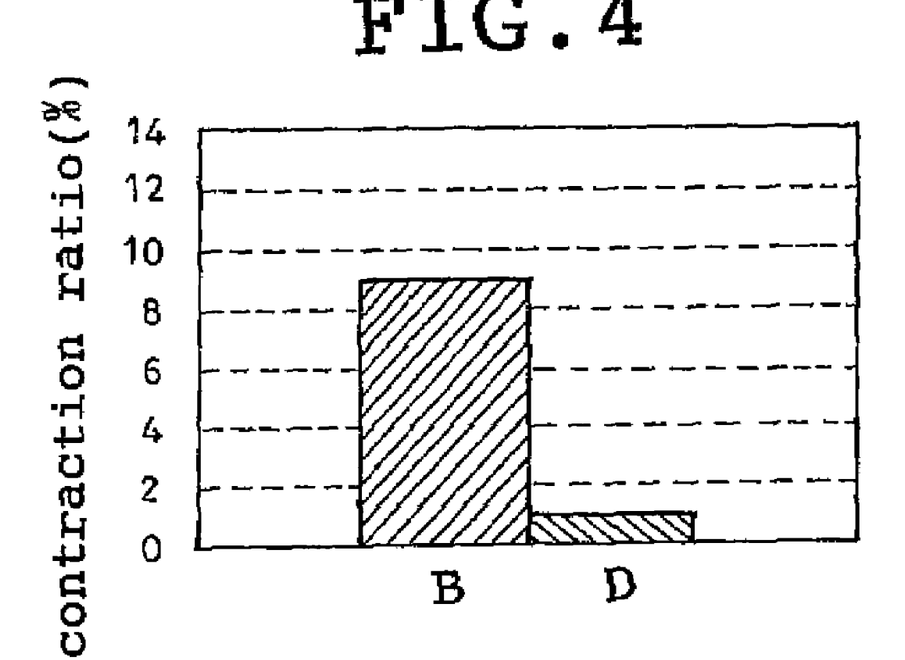
FIG. 4 is a graph showing a film contraction ratio in percentage of an $Si_3N_4$ film formed by using BTBAS and $NH_3$ as raw gases.
Figure 5:
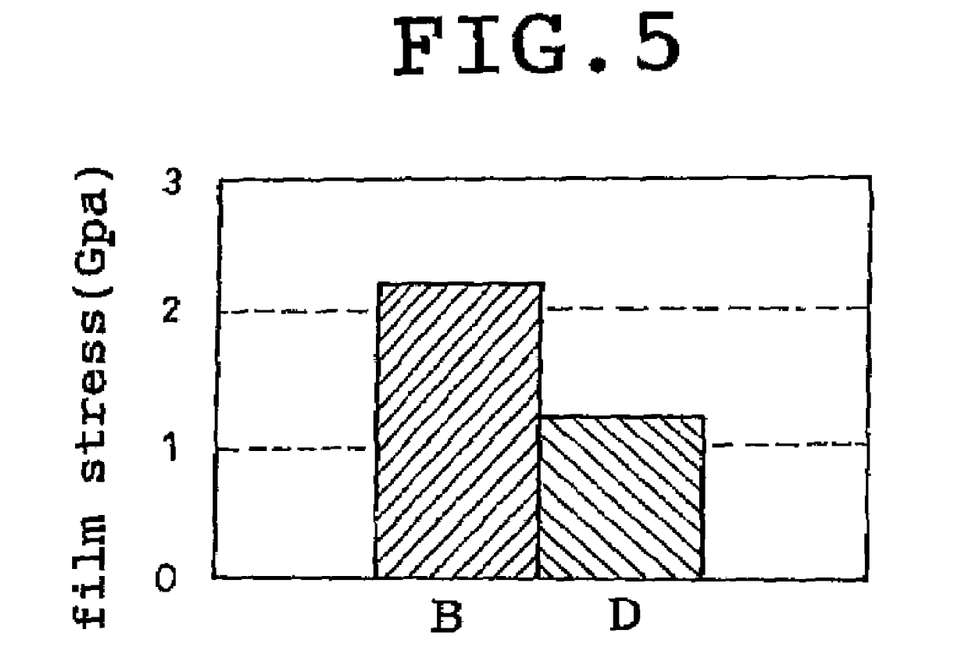
FIG. 5 is a graph showing a film stress the $Si_3N_4$ formed by using BTBAS and $NH_3$ as raw gases.

That is, BTBAS and $NH_3$ introduced in a furnace are decomposed by heat, and the $Si_3N_4$ film is formed not only on a wafer but also on an inner wall of a quartz reaction tube and an inner member made of quartz used in the reaction tube. The $Si_3N_4$ film formed using BTBAS has a strong film stress and a film shrinkage ratio is great. A $Si_3N_4$ film formed by using DCS and $NH_3$ and an $Si_3N_4$ film formed by using BTBAS and $NH_3$ were compared with each other. Comparison data of a film contraction ratio in percentage is shown in FIG. 4, and comparison data of film stress is shown in FIG. 5. In FIGS. 4 and 5, "B" shows an $Si_3N_4$ film formed by using BTBAS and $NH_3$, and "D" shows an $Si_3N_4$ film formed by using DCS and $NH_3$. The film stress means a tensile force (film stress), and the $Si_3N_4$ film formed on a reaction furnace quartz comes off by the film stress. The film is shrunk by a high temperature (about 600° C.) of the reaction furnace. Since quartz does not shrink or expand by heat and thus, distortion occurs. Therefore, when the $Si_3N_4$ film becomes thick, a microcrack is generated, and particles are generated on the wafer. A thickness of an $Si_3N_4$ film that may cause the microcrack is 4,000 Å.

Figure 1:
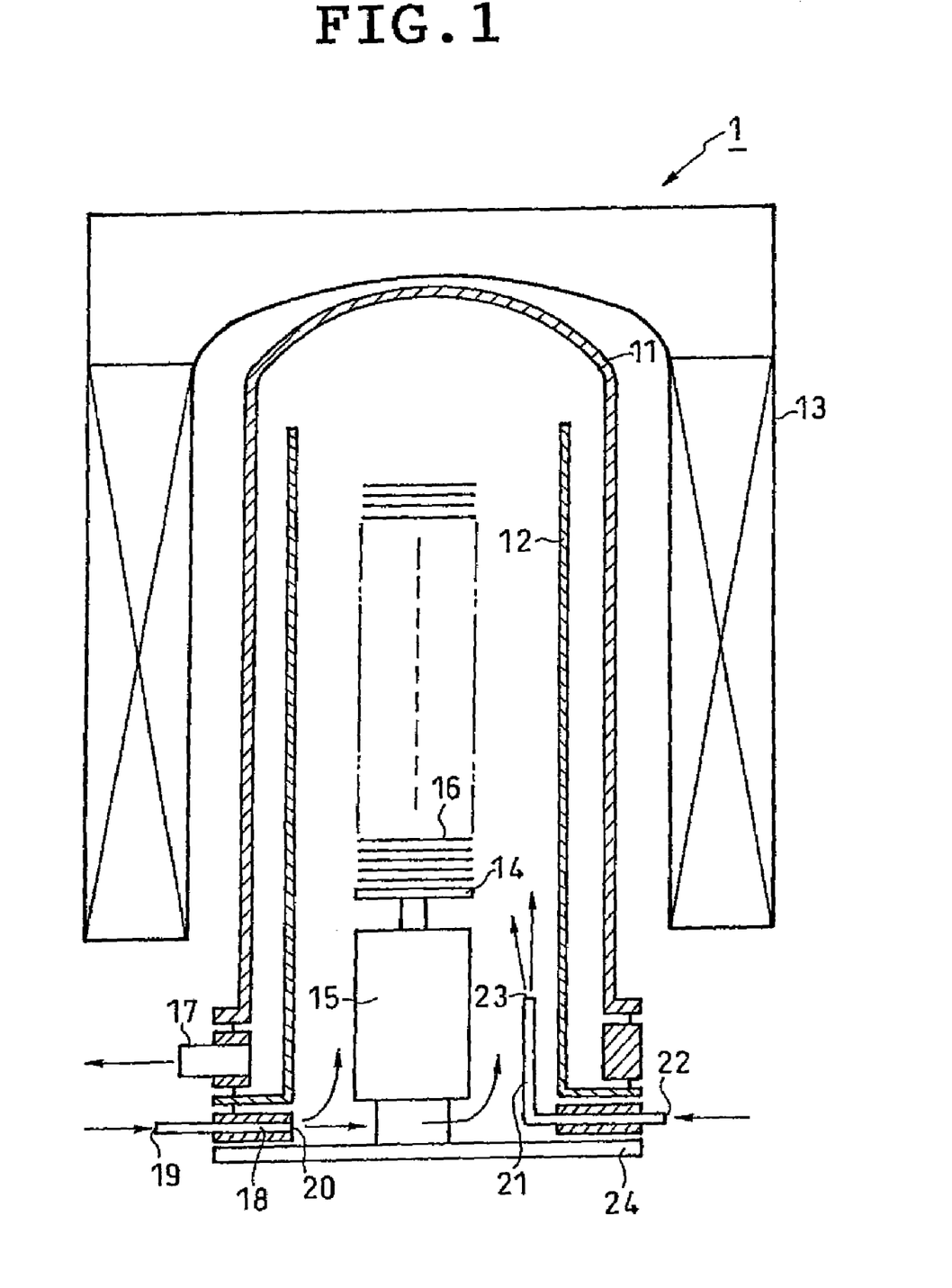
FIG. 1 is a schematic sectional view for explaining a vertical-type LPCVD film forming apparatus used in one embodiment of the present invention.

To solve the problem of the particles, it is necessary to perform maintenance in such a manner that whenever a film thickness becomes 4,000 Å, a quartz inner tube 12, a quartz boat 14, and a quartz cap 15 of an vertical-type LPCVD (Low Pressure Chemical Vapor Deposition) film forming apparatus 1 are disassembled, and they are subjected to wet cleaning using HF (hydrogen fluoride) to remove the $Si_3N_4$ film. When one time film forming operation forms a film of 1,000 Å thickness, it is necessary to perform the maintenance every four film forming operations. Further, there is a problem that it takes 16 hours to complete the maintenance, and this is too long.

Thereupon, it is a main object of the present invention to solve the problem of high frequency of maintenance when an $Si_3N_4$ film is produced using BTBAS and $NH_3$, and to provided a manufacturing method and a manufacturing apparatus of a silicon nitride film capable of reducing the maintenance frequency as small as possible and suppressing or preventing generation of particles.

According to a first aspect of the present invention, there is provided a semiconductor device manufacturing method, comprising:

a first step of forming, by a thermal chemical vapor deposition method, a silicon nitride film on an object disposed in a reaction container, with bis tertiary butyl amino silane and $NH_3$ flowing into the reaction container, and a second step of removing silicon nitride formed in the reaction container, with $NF_3$ gas flowing into the reaction container.

Preferably, the semiconductor device manufacturing method according to the first aspect of the present invention further comprises the first step after the second step. That is the semiconductor device manufacturing method according to the first aspect of the present invention preferably comprises the first step, thereafter the second step and thereafter the first step again.

Preferably, after repeating the first step predetermined times, the silicon nitride formed in the reaction container is removed, with $NF_3$ gas flowing into the reaction container.

Preferably, before the silicon nitride formed in the reaction container has a predetermined thickness, the silicon nitride formed in the reaction container is removed, with $NF_3$ gas flowing into the reaction container.

Preferably, before the silicon nitride formed in the reaction container has such a thickness as to generate particles on the object, the silicon nitride formed in the reaction container is removed, with $NF_3$ gas flowing into the reaction container.

Preferably, the reaction container itself is made of quartz and/or a member made of quartz is used in the reaction container, and before a thickness of the silicon nitride formed on the quartz is increased to such an extent as to generate particles on the object, $NF_3$ gas is allowed to flow into the reaction container to remove the silicon nitride formed on the quartz. In this case, it is preferable to remove the silicon nitride with $NF_3$ gas before the thickness of the silicon nitride becomes 4000 Å or larger.

Preferably, the second step is carried out in a state where a pressure in the reaction container is set to 10 Torr or higher.

Preferably, the semiconductor device manufacturing method according to the first aspect of the present invention further comprises a step of purging the reaction container using $NH_3$ gas at least one of before and after the first step.

According to a second aspect of the present invention there is provided a semiconductor manufacturing apparatus comprising a reaction container, wherein a silicon nitride film is formed, by a thermal chemical vapor deposition method, on an object disposed in the reaction container, with bis tertiary butyl amino silane and $NH_3$ flowing into the reaction container, and silicon nitride formed in the reaction container is removed, with $NF_3$ gas flowing into the reaction container.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Next, one embodiment of the present invention will be explained with reference to the drawings below.

Figure 2:
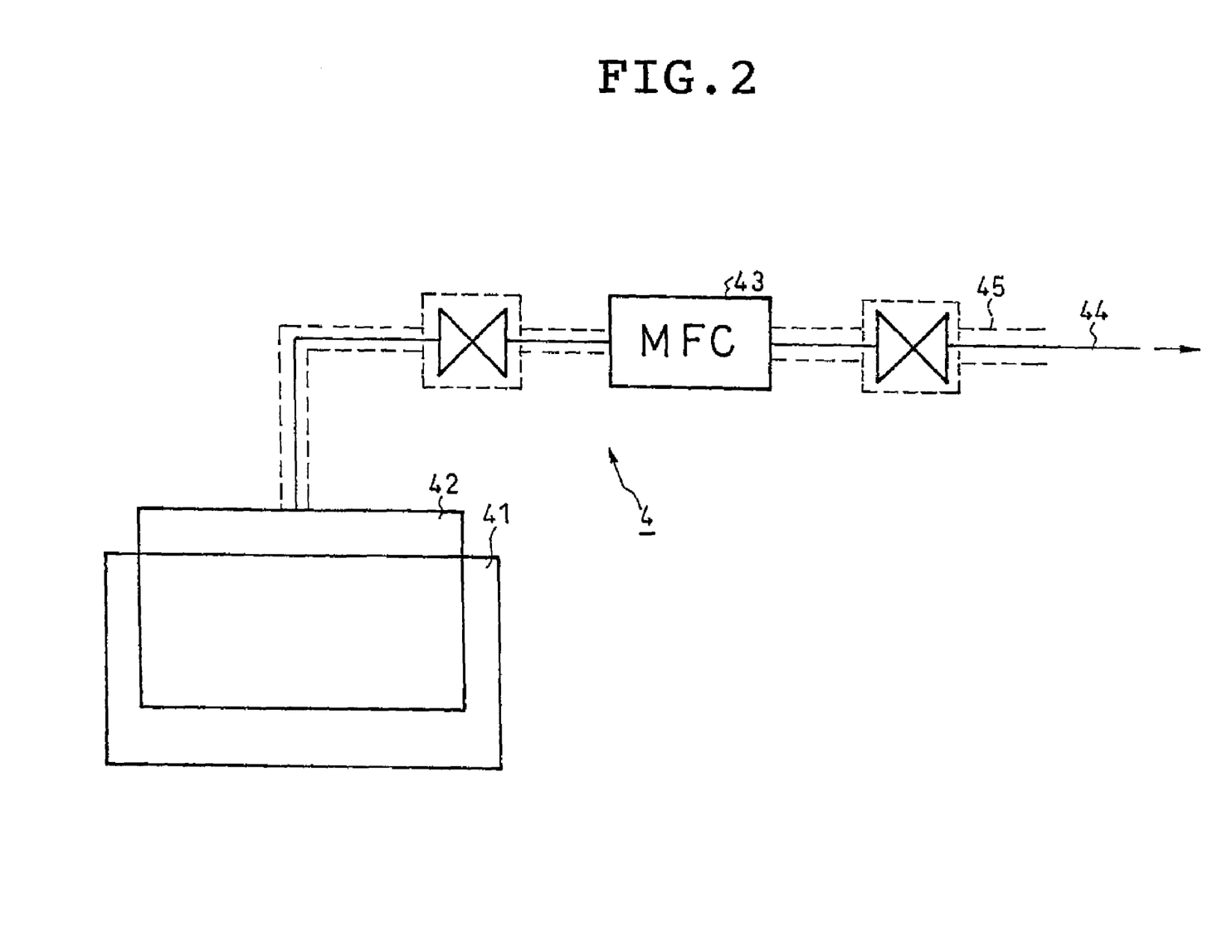
FIG. 2 is a schematic view for explaining one example of a BTBAS supply apparatus preferably used in the film forming apparatus used in the one embodiment of the present invention.
Figure 3:
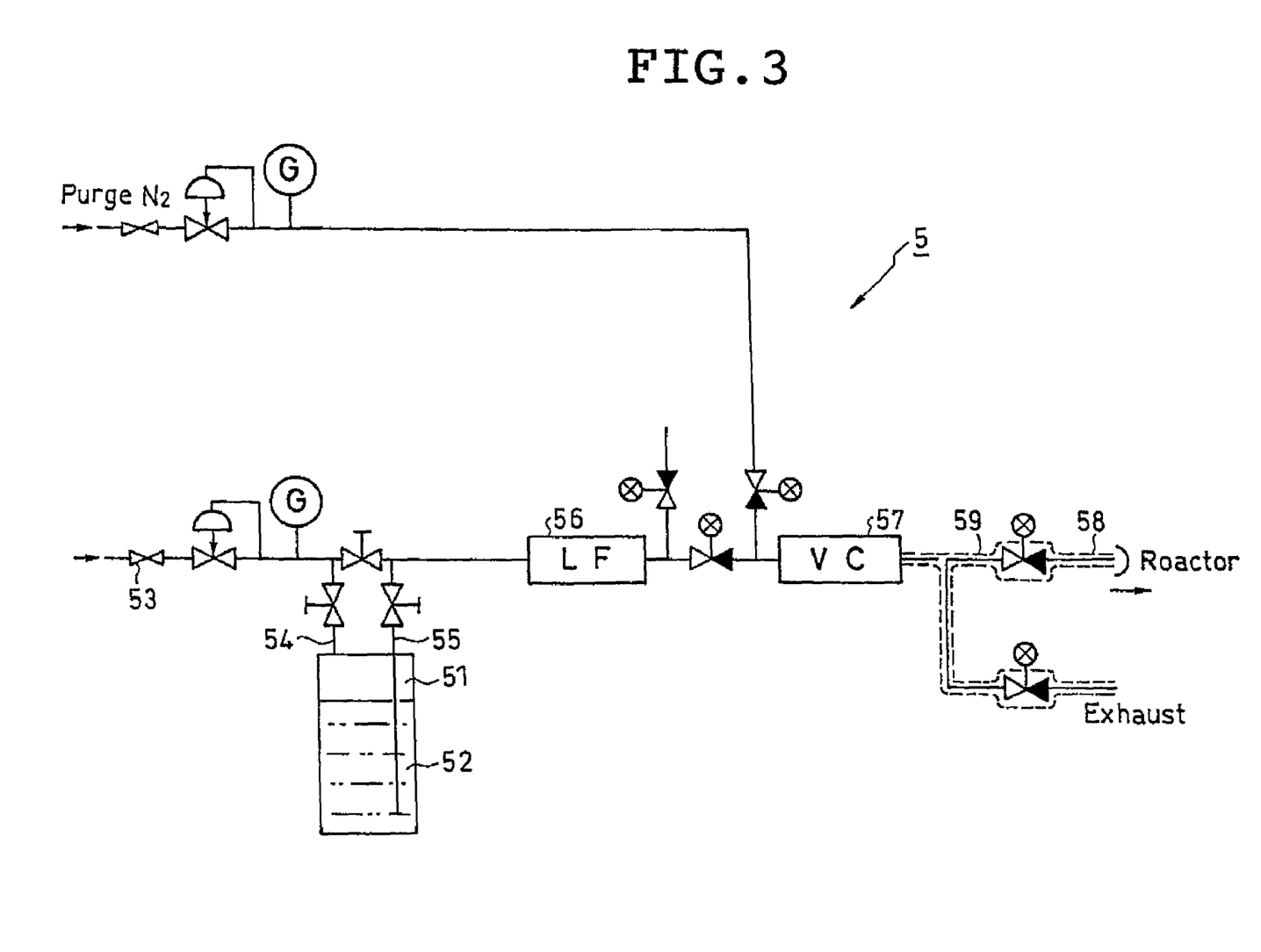
FIG. 3 is a schematic view for explaining another example of a BTBAS supply apparatus preferably used in the film forming apparatus used in the one embodiment of the present invention.

Since BTBAS used in the present invention is in a liquid state at room temperature, the BTBAS is introduced into a furnace using a BTBAS supply apparatus shown in FIGS. 2 and 3.

A BTBAS supply apparatus shown in FIG. 2 is a combination of a thermostatic bath and gas flow rate control. A BTBAS supply apparatus shown in FIG. 3 controls a flow rate by a combination of a liquid flow rate control and a vaporizer.

Referring to FIG. 2, in the BTBAS supply apparatus 4, an interior of a thermostatic bath 41 containing a BTBAS liquid raw material 42 therein is heated to about 100° C. to increase a vapor pressure of BTBAS, thereby evaporating the BTBAS. Then, the evaporated BTBAS is controlled in flow rate by a mass-flow controller 43, and supplied, from a BTBAS supply port 44, to a supply port 22 of a nozzle 21 of an vertical-type LPCVD (low pressure CVD) film forming apparatus shown in FIG. 1. In the BTBAS supply apparatus 4, pipes from the BTBAS liquid raw material 42 to the BTBAS supply port 44 are covered with pipe heating members 45.

Referring to FIG. 3, in the BTBAS supply apparatus 5, push-out gas of He or $N_2$ introduced from a push-out gas introducing port 53 is introduced, through a pipe 54, into a BTBAS tank 51 containing a BTBAS liquid raw material 52 therein, thereby pushing out the BTBAS liquid raw material 52 into a pipe 55. Then, the BTBAS liquid raw material 52 is controlled in flow rate by a liquid flow-rate control apparatus 56 and sent to a vaporizer 57. In the vaporizer 57, the BTBAS liquid raw material 52 is evaporated and supplied, from a BTBAS supply port 58, to the supply port 22 of the nozzle 21 of the vertical-type LPCVD (low pressure CVD) film forming apparatus shown in FIG. 1. In the BTBAS supply apparatus 5, pipes from the vaporizer 57 to the BTBAS supply port 58 are covered with pipe heating members 59.

Next, the vertical-type LPCVD film forming apparatus which can preferably be used in the present embodiment will be explained with reference to FIG. 1.

In the vertical-type LPCVD film forming apparatus 1, a heater 13 is provided outside of a quartz reaction tube 11 so that an interior of the quartz reaction tube 11 can be heated uniformly. A quartz inner tube 12 is provided in the quartz reaction tube 11. A quartz boat 14 is provided in the quartz inner tube 12, and a plurality of semiconductor wafers are mounted on the quartz boat 14 and stacked in the vertical direction. The quartz boat 14 is mounted on a cap 15. The quartz boat 14 is brought into and out from the quartz inner tube 12 by vertically moving the cap 15. Lower portions of the quartz reaction tube 11 and the quartz inner tube 12 are opened, but they are air-tightly closed by a bottom plate 24 of the cap 15 by moving the cap 15 upward. Apparatus nozzles 18 and 21 are provided in lower portions of the quartz inner tube 12 such as to bring into communication with the quartz inner tube 12. An upper portion of the quartz inner tube 12 is opened. A discharge port 17 is provided at a lower portion of space between the quartz inner tube 12 and the quartz reaction tube 11 so as to bring into communication with the space. The discharge port 17 is in communication with a vacuum pump (not shown) so as to evacuate the quartz reaction tube 11. The raw gases supplied from the quartz nozzles 18 and 21 are injected from injection ports 20 and 23 into the quartz inner tube 12. The gases then move in the quartz inner tube 12 from its lower portion to its upper portion, thereafter downwardly flows through the space between the quartz inner tube 12 and the quartz reaction tube 11, and is discharged from the discharge port 17.

A method for forming a silicon nitride film using the vertical-type LPCVD film forming apparatus 1 will be explained next.

First, the quartz boat 14 holding a large number of semiconductor wafers 16 is inserted into the quartz inner tube 12 the inside temperature of which is maintained at 600° C. or lower.

Next, the quartz reaction tube 11 is evacuated from the discharge port 17 to produce a vacuum therein using a vacuum pump (not shown). In order to stabilize a temperature over the entire surface of the wafer, it is preferable to evacuate for about one hour.

Next, $NH_3$ gas is charged from a charging port 19 of the quartz nozzle 18 to purge the inside of the quartz reaction tube 11 using $NH_3$ before BTBAS is charged.

Then, while $NH_3$ gas is continuously charged from a charging port 19 of the quartz nozzle 18, BTBAS is charged from the charging port 22 of the quartz nozzle 21, and an $Si_3N_4$ film is formed on the semiconductor wafer 16.

Next, the supply of BTBAS is stopped while keep charging the $NH_3$ gas from the charging port 19 of the quartz nozzle 18, thereby purging the quartz reaction tube 11 using $NH_3$.

If only BTBAS is charged, a film different from the Si$_3$N$_4$ film is formed and thus, it is preferable to purge the quartz reaction tube 11 using NH$_3$ before and after deposition.

Next, N$_2$ is allowed to flow into the quartz reaction tube 11 from the quartz nozzle 18 to purge the quartz reaction tube 11 using N$_2$, thereby removing NH$_3$ in the quartz reaction tube 11.

Then, the supply of N$_2$ is stopped and the quartz reaction tube 11 is evacuated to produce a vacuum therein. A set of the purge operation using N$_2$ and the subsequent evacuation operation in the quartz reaction tube 11 is carried out several times.

Thereafter, the interior of the quartz reaction tube 11 is brought back from the vacuum state into the atmospheric pressure state. Then, the quartz boat 14 is moved down and taken out from the quartz reaction tube 11. Then, the quartz boat 14 and the semiconductor wafers 16 are cooled down to room temperature.

The above-described silicon nitride film forming method is repeated, and when a thickness of the Si$_3$N$_4$ film formed in the quartz reaction tube 11 reached 3,000 Å, NF$_3$ gas is introduced into the quartz reaction tube 11 from the quartz nozzle 18, thereby carrying out in situ cleaning of the Si$_3$N$_4$ film.

Next, this cleaning method will be explained.

First, the quartz boat 14 holding no semiconductor wafer 16 is inserted into the quartz inner tube 12 the inside temperature of which is maintained at 600° C.

Next, the quartz reaction tube 11 is evacuated from the discharge port 17 to produce a vacuum therein using the vacuum pump (not shown).

Then, NF$_3$ gas is charged from the charging port 19 of the quartz nozzle 18 at a flow rate of 500 sccm, the quartz reaction tube 11 is evacuated to produce a vacuum therein from the discharge port 17 using the vacuum pump (not shown), a pressure in the quartz reaction tube 11 is maintained at 10 Torr or higher, and the interior of the quartz reaction tube 11 is cleaned.

Then, the supply of NF$_3$ gas is stopped, the quartz reaction tube 11 is evacuated to provide a vacuum therein from the discharge port 17 using the vacuum pump (not shown), and residue NF$_3$ gas is discharged.

Next, N$_2$ is allowed to flow into the quartz reaction tube 11 from the quartz nozzle 18 to purge the quartz reaction tube 11 using N$_2$ to remove NF$_3$ in the quartz reaction tube 11.

Then, the quartz reaction tube 11 is evacuated to produce a vacuum therein from the discharge port 17 using the vacuum pump (not shown). The evacuation operation and the purge operation using N$_2$ are carried out several times.

Thereafter, the interior of the quartz reaction tube 11 is brought back from the vacuum state into the atmospheric pressure state. Then, the quartz boat 14 is moved down and taken out from the quartz reaction tube 11.

At the time of cleaning using NF$_3$, when the Si$_3$N$_4$ film is etched, the quartz is also adversely etched at the same time. Therefore, important is condition in which the Si$_3$N$_4$ film is largely etched, and the quartz (SiO$_2$) is etched as little as possible.

Figure 6:
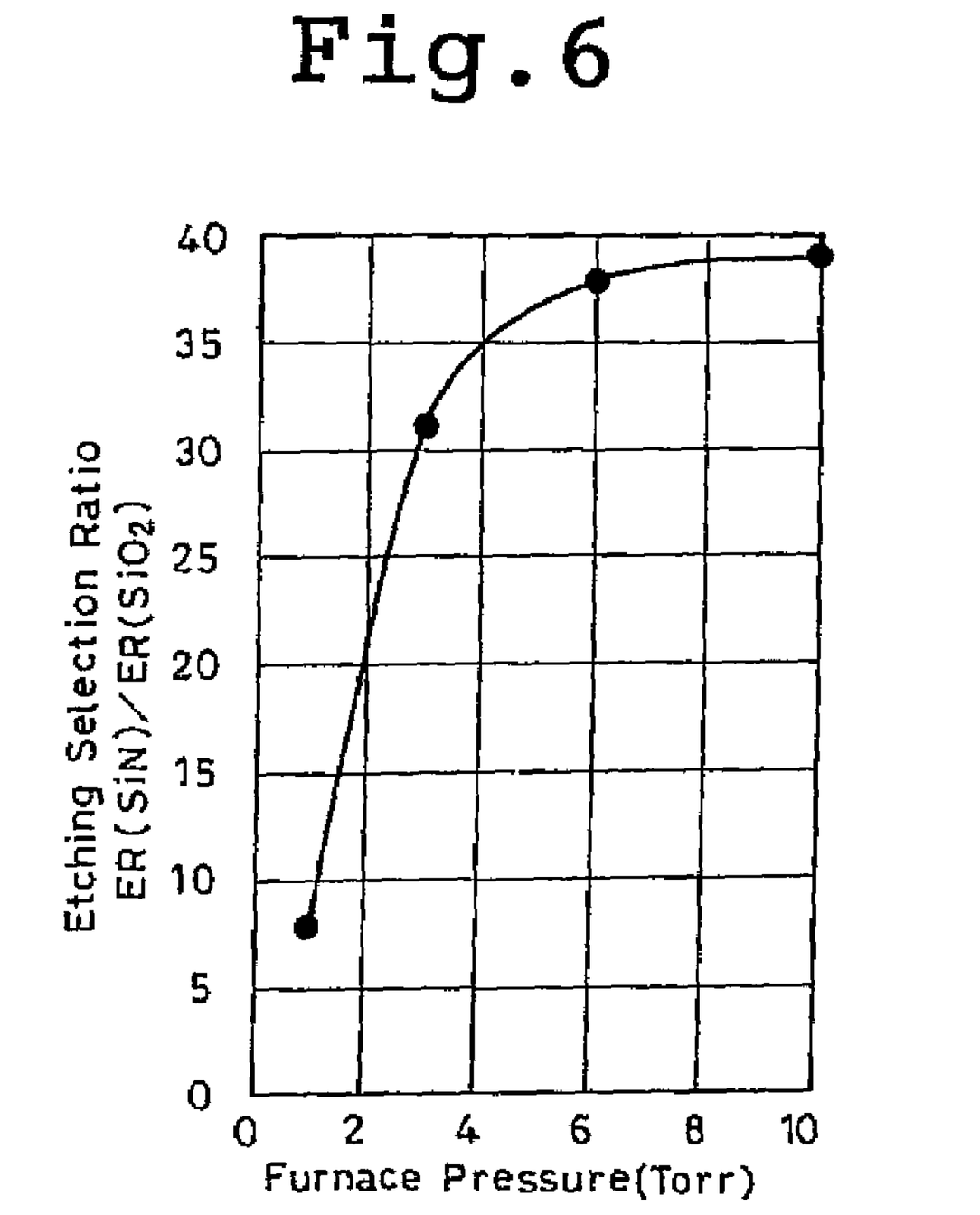
FIG. 6 is a graph showing a etching selection ratio by $NF_3$ of the $Si_3N_4$ film formed by using BTBAS and $NH_3$ as raw gases.

FIG. 6 shows a relation between a pressure and an etching selection ratio. In this figure, the horizontal axis shows a pressure in the quartz reaction tube 11, and the vertical axis shows a ratio of an etching rate (ER (SiN)) of the Si$_3$N$_4$ film to an etching rate (ER (SiO$_2$)) of the quartz. Referring to FIG. 6, it can be found that as the pressure becomes higher, the etching selection ratio is increased, and the quartz (SiO$_2$) becomes less prone to be etched. For these reason, it is preferable to set the pressure to 10 Torr or higher. Further, by further increasing the pressure, the etching selection ratio becomes more excellent, and the etching rate is also enhanced and thus, the etching time can be shortened. For example, although the etching time is about 30 minutes when the pressure is set to 10 Torr, when the pressure is set to 70 Torr, almost the same etching can be carried out for about 15 minutes.

Figure 7:
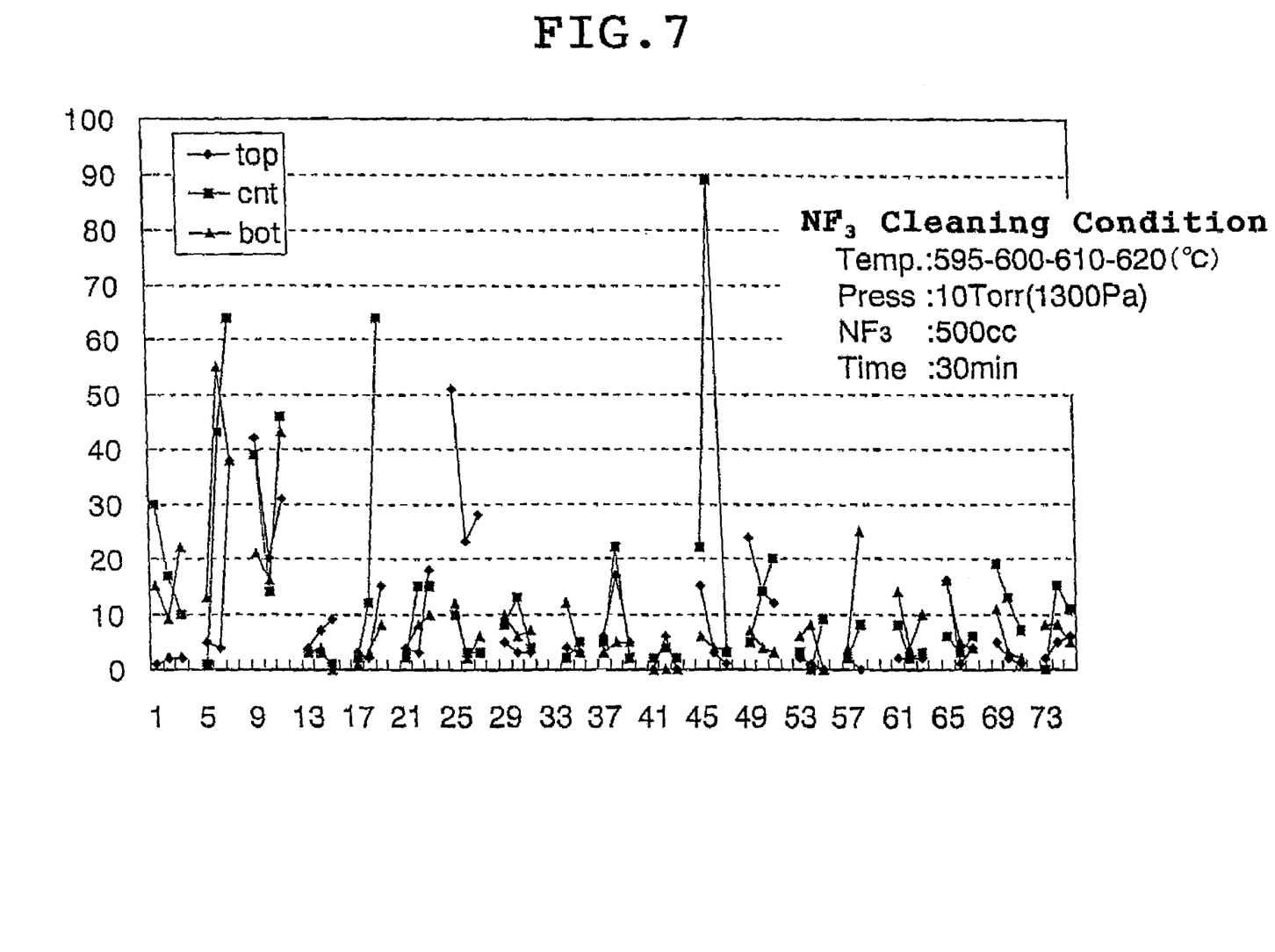
FIG. 7 is a graph showing a continuous film forming state wherein $NF_3$ cleaning is performed every 3,000 Å thickness of the $Si_3N_4$ film formed by using BTBAS and $NH_3$ as raw gases.

By carrying out the NF$_3$ cleaning whenever the thickness of the formed Si$_3$N$_4$ film reaches 3000 Å, it is possible to form particle-free Si$_3$N$_4$ films 100 times continuously in a maintenance-free manner. FIG. 7 shows data. In FIG. 7, the horizontal axis shows the number of film forming operations, a blank exists every three times operation. The blank shows the NF$_3$ cleaning operation. The vertical axis shows the number of foreign particles of 0.18μ or greater particle size on the wafer. The cleaning operation using NF$_3$ gas was carried out in such a manner that NF$_3$ gas was charged into the quartz reaction tube 11 at a flow rate of 500 scam, the quartz reaction tube 11 was evacuated to produce a vacuum therein, the pressure in the quartz reaction tube 11 was maintained at 10 Torr (1,300 Pa), a temperature therein was set to about 600° C., and the cleaning operation was carried out for 30 minutes. In FIG. 7, "top" means a 115th wafer from the bottom, "cnt" means 66th wafer from the bottom, and "bot" means a 16th wafer from the bottom, when 125 wafers were processed.

Time required for carrying out the NF$_3$ cleaning operation once is 2.5 hours (it takes 30 minutes to flow NF$_3$ gas, and the remaining time are required for bringing up the boat and evacuating to produce a vacuum and the like), and there is a merit if compared with 16 hours required for conventional maintenance.

As described above, according to the preferred embodiment of the present invention, when Si$_3$N$_4$ films are formed using BTBAS and NH$_3$, it is possible to reduce the frequency of maintenance as small as possible and to suppress or prevent the generation of particles.

The entire disclosure of Japanese Patent Application No. 11-333129 filed on Nov. 24, 1999 including specification, claims, drawings and summary are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A semiconductor device manufacturing method, comprising:

forming, by a thermal chemical vapor deposition method, a silicon nitride film on an object to be film-formed disposed in a reaction container, with bis tertiary butyl amino silane and NH$_3$ flowing into said reaction container, and removing silicon nitride formed in said reaction container, with cleaning gas flowing into said reaction container, before said silicon nitride formed in said reaction container reaches a thickness of 4,000 Å.

2. A semiconductor device manufacturing method as recited in claim 1, wherein said removing said silicon nitride is carried out when said silicon nitride formed in said reaction container reaches a thickness of equal to or more than 3,000 Å and less than 4,000 Å.

3. A semiconductor device manufacturing method as recited in claim 1, wherein said removing said silicon nitride is carried out after said silicon nitride formed in said reaction container reaches a thickness of 3,000 Å.

4. A semiconductor device manufacturing method as recited in claim 1, wherein
said removing said silicon nitride is carried out when said silicon nitride formed in said reaction container reaches a thickness of equal to or less than 3,000 Å.

5. A semiconductor device manufacturing method, comprising:
forming a silicon nitride film on an object to be film-formed disposed in a reaction container made of quartz, with bis tertiary butyl amino silane and $NH_3$ flowing into said reaction container; and
removing silicon nitride formed in said reaction container, with cleaning gas flowing into said reaction container, before said silicon nitride formed in said reaction container reaches a thickness of 4,000 Å and a microcrack is generated in the quartz.

6. A semiconductor device manufacturing method comprising:
inserting a boat made of quartz and holding an object to be film-formed into a reaction container made of quartz;
forming a silicon nitride film on the object held by said boat in said reaction container, with bis tertiary butyl amino silane and $NH_3$ as raw gases flowing into said reaction container;
carrying said boat holding the object after said silicon nitride film-forming out of said reaction container;
inserting said boat not holding the object into said reaction container;
removing silicon nitride formed in said reaction container and on said boat, with cleaning gas flowing into said reaction container in which said boat not holding the object is inserted, before said silicon nitride formed in said reaction container or on said boat reaches a thickness of 4,000 Å and a microcrack is generated in the quartz; and
carrying said boat not holding the object out of said reaction container.

7. A semiconductor device manufacturing method, comprising:
forming a silicon nitride film on an object to be film-formed disposed in a reaction container, with bis tertiary butyl amino silane and $NH_3$ flowing into said reaction container; and
removing silicon nitride formed in said reaction container, with cleaning gas flowing into said reaction container, when said silicon nitride formed in said reaction container reaches a thickness of 3,000 Å.

8. A semiconductor device manufacturing method comprising:
inserting a boat holding an object to be film-formed into a reaction container;
forming a silicon nitride film on the object held by said boat in said reaction container, with bis tertiary butyl amino silane and $NH_3$ as raw gases flowing into said reaction container;
carrying said boat holding the object after said silicon nitride film-forming out of said reaction container;
inserting said boat not holding the object into said reaction container;
removing silicon nitride formed in said reaction container and on said boat, with cleaning gas flowing into said reaction container in which said boat not holding the object is inserted, when said silicon nitride formed in said reaction container or on said boat reaches a thickness of 3,000 Å; and
carrying said boat not holding the object out of said reaction container.

9. A semiconductor device manufacturing method, comprising:
forming, by a thermal chemical vapor deposition method, a silicon nitride film on an object to be film-formed disposed in a reaction container made of quartz, with bis tertiary butyl amino silane and $NH_3$ flowing into said reaction container; and
thereafter removing silicon nitride formed in said reaction container, with $NF_3$ gas flowing into said reaction container in a state where a pressure in said reaction container is kept 10 Torr to 70 Torr, before said silicon nitride formed in said reaction container reaches a thickness of 4,000 Å.

10. A semiconductor device manufacturing method, comprising:
forming, by a thermal chemical vapor deposition method, a silicon nitride film on an object to be film-formed disposed in a reaction container made of quartz, with bis tertiary butyl amino silane and $NH_3$ flowing into said reaction container; and
thereafter removing silicon nitride formed in said reaction container, with $NF_3$ gas flowing into said reaction container in a state where a pressure in said reaction container is kept 10 Torr to 70 Torr, when said silicon nitride formed in said reaction container reaches a thickness of 3,000 Å.

* * * * *